United States Patent

Colombo

[19]

[11] Patent Number: 5,951,767
[45] Date of Patent: *Sep. 14, 1999

[54] MOLECULAR BEAM EPITAXY ISOLATION TUBE SYSTEM

[75] Inventor: Paul E. Colombo, St. Paul, Minn.

[73] Assignee: Chorus Corp., St. Paul, Minn.

[ * ] Notice: This patent is subject to a terminal disclaimer.

[21] Appl. No.: 09/129,011

[22] Filed: Aug. 4, 1998

Related U.S. Application Data

[63] Continuation of application No. 08/759,114, Dec. 2, 1996, Pat. No. 5,788,776.
[51] Int. Cl.$^6$ .................................................. C23C 14/00
[52] U.S. Cl. .......................... 118/688; 118/708; 118/710; 118/712; 118/724; 118/726
[58] Field of Search ..................................... 118/688, 708, 118/710, 712, 724, 726

[56] References Cited

U.S. PATENT DOCUMENTS 5,588,999 12/1996 Takahashi ................................ 118/726

*Primary Examiner*—Richard Bueker
*Attorney, Agent, or Firm*—Skinner and Associates

[57] ABSTRACT

A molecular beam epitaxy (MBE) growth chamber which provides separate longitudinally oriented isolation chambers for each effusion cell thereof. Wall structures bounding each isolation chamber are hollow to receive cryogenic material and are in fluid communication with each other. Each isolation chamber has an interior and exterior portal which provide fluid communication between the isolation chambers and the space inside the MBE chamber. An effusion cell is mounted in the interior portal to direct a portion of effusion material through the interior portal in a beam toward a substrate in the MBE chamber. Another portion of the effusion material is directed along the inside of the isolation chamber toward a sensor which controls the effusion cell. The isolation chambers facilitate measurement and control of individual materials effused from separate cells even when those cells are operated simultaneously.

5 Claims, 5 Drawing Sheets

MOLECULAR BEAM EPITAXY ISOLATION TUBE SYSTEM

CROSS-REFERENCE TO RELATED APPLICATIONS

This is a continuation of U.S. application Ser. No. 08/759,114, filed Dec. 02, 1996, now U.S. Pat. No. 5,788,776.

STATEMENT REGARDING FEDERALLY SPONSORED RESEARCH OR DEVELOPMENT

Not applicable.

REFERENCE TO A MICROFICHE APPENDIX

Not applicable.

BACKGROUND OF THE INVNTION

1. Field of the Invention

This invention relates to apparatus and methods for the preparation of substrates and deposition processes used in the compound semiconductor and related industries. More particularly, the invention relates to molecular beam epitaxy (MBE) apparatus and methods. The apparatus and methods of this invention provide an improved MBE growth chamber. 2.

2. Background Information

Molecular beam epitaxy is a growth process which involves the deposition of thin films onto a heated crystalline substrate in a vacuum by directing molecular or atomic beams onto the substrate. Deposited atoms and molecules migrate to energetically preferred lattice positions on the substrate, which is heated, yielding film growth of high crystalline quality, and optimum film thickness uniformity. MBE is widely used in compound semiconductor research and in the semiconductor device fabrication industry, for thin-film deposition of elemental semiconductors, metals and insulating layers.

Referring to FIG. 1, in MBE an effusion cell or source 100 emits gaseous molecules 102 in a beam 104 into an ultra high vacuum environment inside chamber 106. The beam 104 is directed at a predetermined angle toward a substrate (not shown) which is mounted in chamber 106. Each cell 100 deposits a selected element or molecule on the substrate.

Effusion cells exist in a variety of configurations with each configuration tailored for the specific material to be effused. Effusion cells 100 typically have a crucible 110 which contains the effusion material 112, for example aluminum, gallium, indium, or other compounds. The crucible 110 is resistively heated to effuse the material out of an orifice 114 into the chamber 106. The intensity of the beam is controlled by the temperature of the crucible. On each cell 100 a shutter 108 positioned near orifice 114 typically controls the flow of beam 102 by redirecting the beam away from the substrate.

High purity gases such as hydrogen and high vapor pressure materials such as arsenic, phosphorous, selenium and sulfur may also be effused by thermally cracking them into dimers or atomic species by means of a high temperature filament or other resistive heating element in an effusion cell. Rather than controlling the flow of the beam with a shutter, a valve can be used with gaseous materials to completely stop the flow of material from the cell.

A variety of crucible designs and effusion cell configurations are used in MBE. A discussion of advantages and disadvantages of various crucible designs is contained in U.S. patent application Ser. No. 08/433,033 entitled UNIBODY CRUCIBLE AND METHOD OF MANUFACTURE THEREFOR, and which is incorporated by reference herein.

In FIG. 2, a plurality of cells 100 are mounted, via ports 116, in a cooled growth chamber 106 which has an ultra high vacuum. Cells 100 can be actuated individually or in conjunction with other cells. Beams 104 are all directed at a substrate 118. The interior of chamber 106 is cooled by cryogenic material 120 circulating inside cryopanels 122, 124, 126, and 128 which are located inside chamber 106.

Regardless of which effusion cell design is used, problems exist with respect to the operation of the multiple cells. Because the effusion cells discharge into a central chamber, it is difficult to measure and control the precise amount of any one material in a mixture when multiple cells are activated simultaneously. It is undesirable to place a sensor directly in the path of the beam, which would create a shadow and disrupt the beam. An sensor placed near the substrate can detect the amount of the mixture, but not the percentage of individual components.

Another problem exists particularly in relation to the cryopanels, which are the typical chamber cooling means. The beams 104 are not actually so tightly focused as FIG. 2 appears to indicate. Molecules diffuse throughout the vacuum chamber depositing themselves on all the surfaces in the chamber. There is also "overspray" from the beams 104 which results in deposits on the horizontal portion 124 of the cryopanels adjacent to the substrate 118. Also, since a shutter merely redirects a beam 104 rather than stopping it, effusion material is redirected toward the vertical side 126 of the cryopanels. Much of the effusion material accumulated on the cryopanels is located above the effusion cells. Accumulated material can fall off the cryopanels onto an effusion cell, which could disrupt the flow of material from that cell, and could contaminate the cell if the material fell into an open crucible.

Despite the need in the art for a chamber design which overcomes the disadvantages, shortcomings and limitations of the prior art, none insofar as is known has been developed or proposed.

Accordingly, it is an object of the present invention to provide an improved chamber design. A specific object of this invention is to provide a growth chamber design which utilizes isolation chambers in a particular orientation with respect to the effusion cells. A further object of the present invention is to provide for measurement and control of the amount of individual components in a mixture of components effused from separate cells. A further object of the present invention is to shelter the effusion cells from falling debris accumulated on cryopanels.

BRIEF SUMMARY OF THE INVENTION

The apparatus of the present invention provides an MBE growth chamber with a tubular structure which provides separate longitudinally oriented isolation chambers for each effusion cell. The tubular structure has a hollow interior wall and a hollow exterior wall connected by a plurality of hollow radially oriented walls located between the interior and exterior walls. All of the hollow interior, exterior, and radially oriented walls are in fluid communication with each other and receive cryogenic material, such as liquid nitrogen. The hollow interior wall has an upper portion with an enlarged hollow section which provides a reservoir of cryogenic material to feed the other wall structures and also to provide a large thermal mass to cool the interior of the MBE growth chamber.

The longitudinally oriented isolation chambers are bounded by the hollow interior, exterior and radially oriented walls. Each isolation chamber has an interior portal through the hollow interior wall and an external portal through the hollow exterior wall which provide fluid communication between the isolation chambers and the space inside and outside of the tubular structure. The interior and exterior portals of an isolation chamber are sized to accommodate an effusion cell mounted at an angle which directs a beam of effusion material directly at substrate mounted inside of the tubular structure. The interior portals are sized and located higher with respect to exterior portals to optimize the direction and spread of each beam to cover the substrate with minimum overspray Each longitudinally oriented isolation chamber has an orifice through which a longitudinally oriented stream of effused material passes and is monitored by a sensor to control by closed loop feedback the intensity of the effused material emitted from the effusion cell. The isolation chambers allow effused material from each cell to be separately monitored and controlled even when a plurality of cells are activated simultaneously.

With the tubular structure of the present invention, effusion cells do not extend inside interior portals. Therefore, cells are not exposed to effusion debris which may fall from any of the cryogenically cooled wall structure during operation.

The features, benefits and objects of this invention will become clear to those skilled in the art by reference to the following description, claims and drawings.

DETAILED DESCRIPTION

Figure 1:
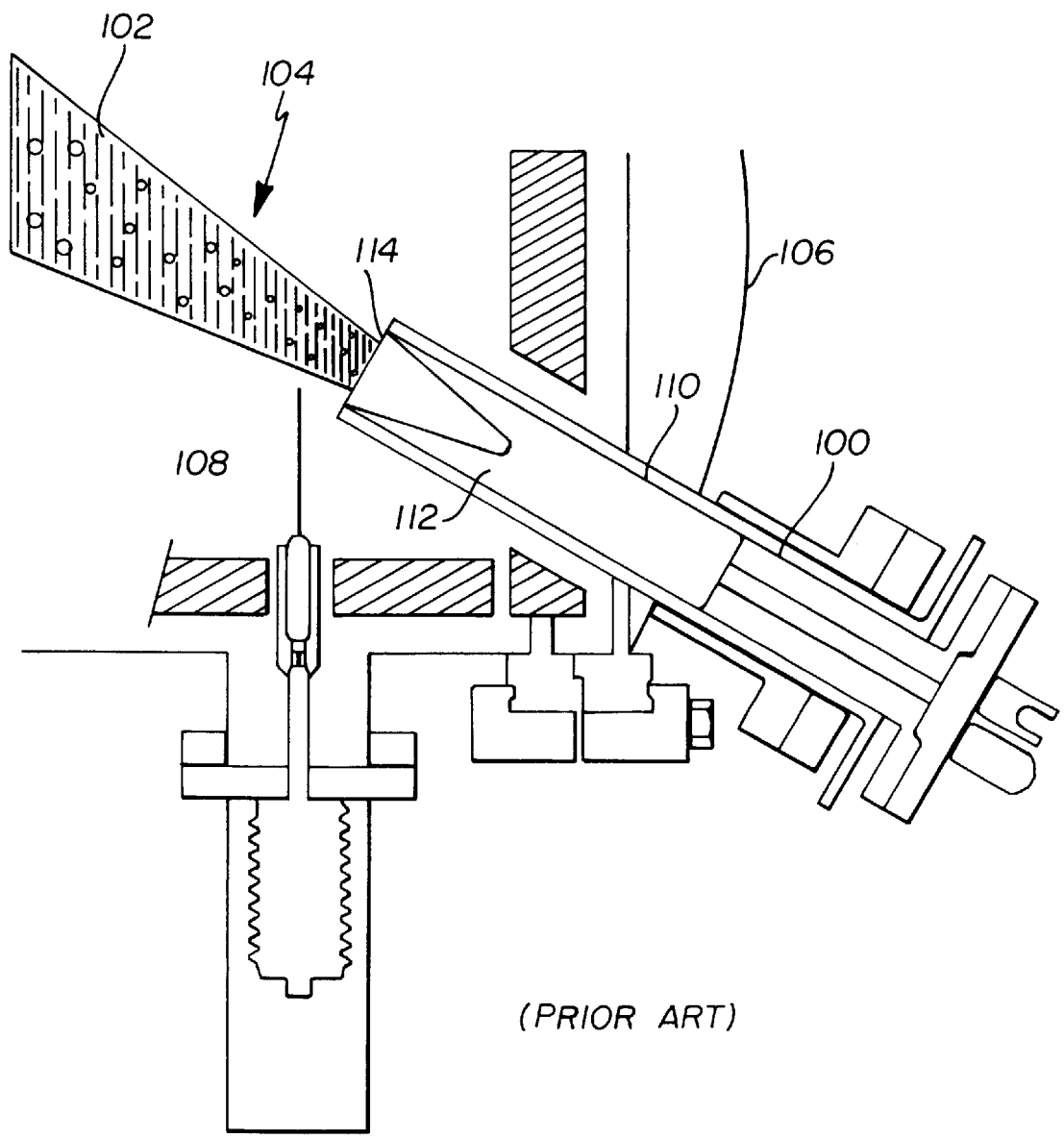
FIG. 1 is a schematic view of an effusion cell and a portion of prior art MBE growth chamber.
Figure 2:
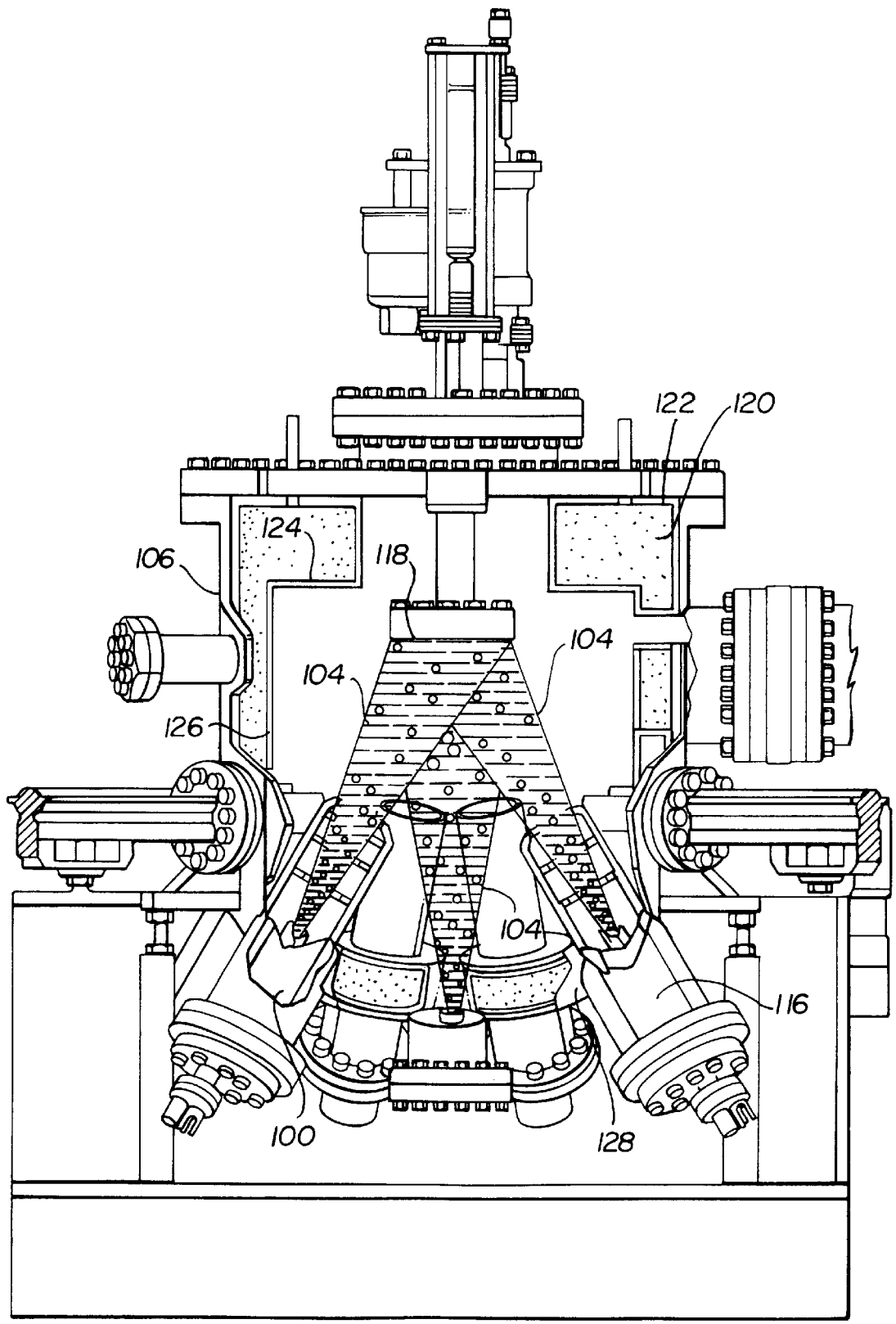
FIG. 2 is a schematic view of a larger portion of a prior art MBE growth chamber with several effusion cells.
Figure 3:
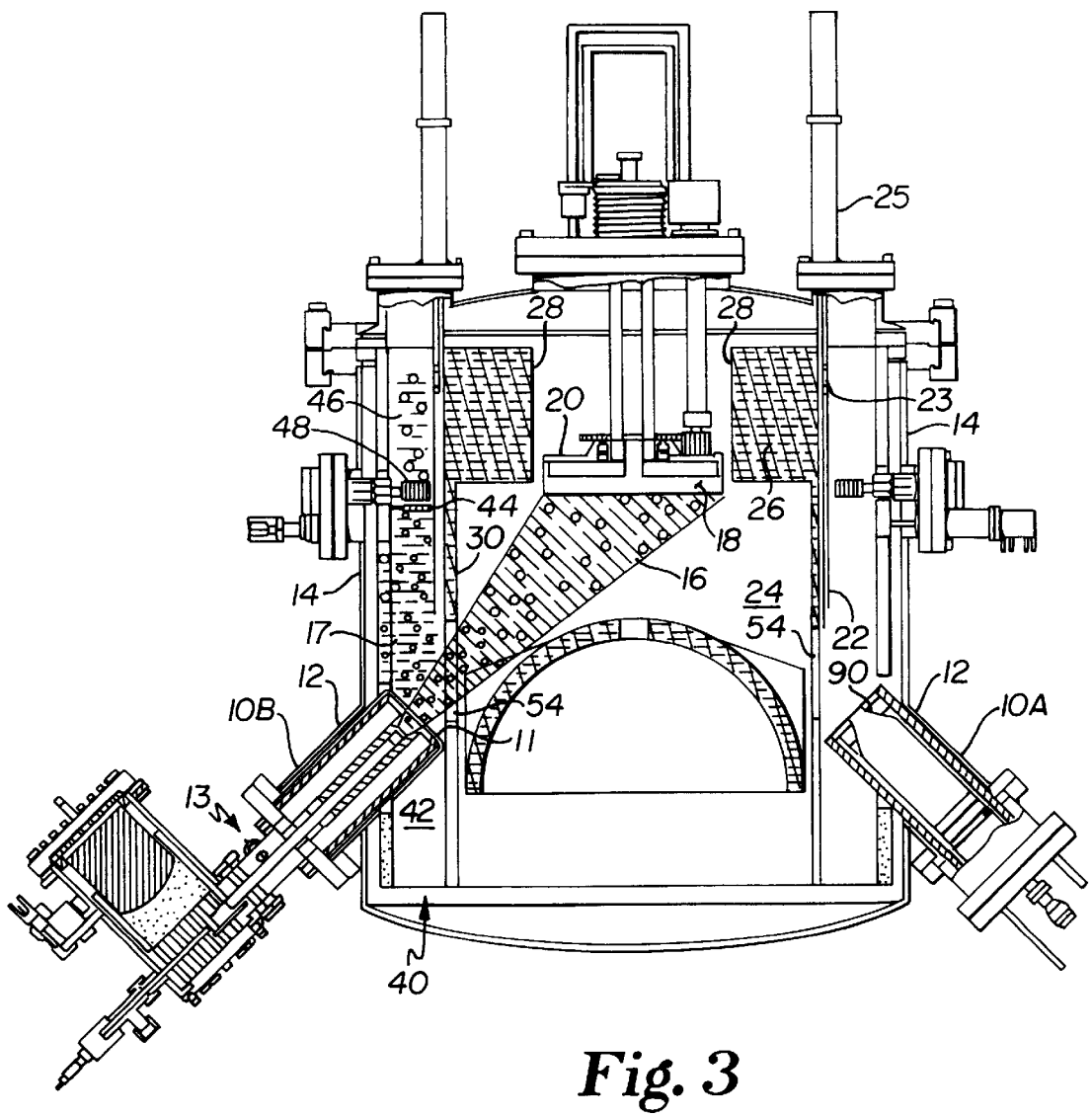
FIG. 3 is a schematic view of a cross section of an MBE growth chamber using an isolation chamber structure of the present invention.
Figure 4:
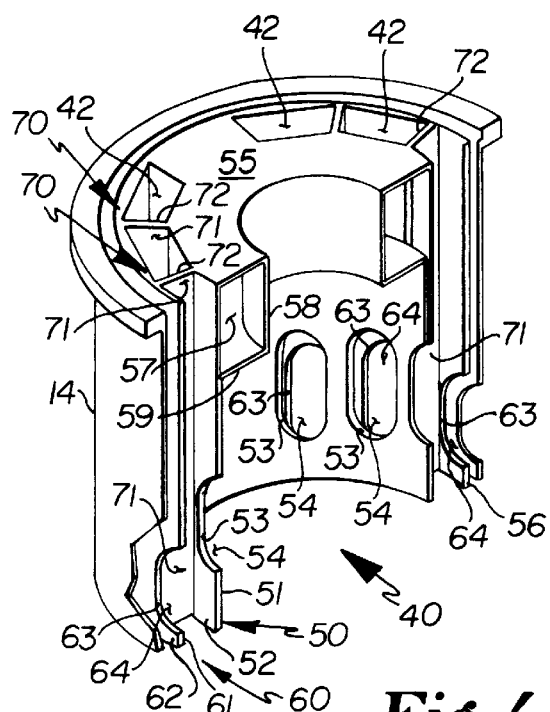
FIG. 4 is a perspective view in cross section of the MBE growth chamber showing the isolation chamber structure.

Referring to FIGS. 3 and 4, an example of the preferred embodiment of the present invention is illustrated and generally indicated by the reference numeral 40. A liquid nitrogen cooled growth chamber 14 has a tubular structure 40 which cooperates with effusion cells 10 which deposit material on a substrate 18 during the epitaxy process.

Referring to FIG. 3, a plurality of effusion cells 10 are mounted, via ports 12, in a liquid nitrogen cooled growth chamber 14 which has an ultra high vacuum, on the order of 1E-11 Torr. Two typical configurations of effusion cells are shown. Configuration 10A typically is used to deposit gallium, indium, or aluminum. Configuration 10B is used to crack high vapor pressure materials such as arsenic, phosphorous, selenium and sulfur into high purity gasses. Each cell 10 generates a beam 16 of effused material 17 which is directed at a predetermined angle through portal 54 toward a substrate 18, for example a gallium arsenide (GaAs) wafer, which is mounted on a downwardly oriented, heated, rotary substrate holder 20. Each cell 10 deposits a selected element or molecule on the substrate. Flow of the beam 16 is typically controlled by a shutter 22. The interior 24 of chamber 14 is cooled by liquid nitrogen 26 or other cryogenic material circulating inside cryopanels 28 located inside of chamber 14. After various preparatory procedures are performed on the substrate, the sources are powered up, heated and unshuttered, whereby the desired epitaxial growth is accomplished on the heated, rotating substrate. After epitaxial growth, the wafer is cooled, inspected and processed for removal.

The present invention provides a growth chamber 14 with a tubular structure 40 which incorporates cryopanels 28 and isolates each effusion cell 10 from each other by forming a plurality of longitudinally oriented isolation chambers 42, one for each cell 10. Each isolation chamber has an interior portal 54 through which effusion material 17 emitted by cell 10 passes to reach substrate 18. Each isolation chamber 42 has a shutter 22 located inside isolation chamber 42 which selectively blocks and opens portal 54. In the preferred embodiment, shutter 22 and its linkage 23 and actuation mechanism 25 are longitudinally oriented with respect to chamber 14 and tubular structure 40, and shutter 22 is moved linearly to selectively block and opens portal 54. When portal 54 is blocked by shutter 22, effusion material 17 can still be emitted from cell 10 into isolation chamber 42. An orifice 44 in each isolation chamber 42 allows a stream 46 of effused material 17 to pass through a sensor 48 for measuring and controlling the intensity of the effused material 17 emitted from a cell 10. The isolation chambers 42 allow effused material from each cell to be separately monitored and controlled even when a plurality of cells are activated simultaneously.

Referring to FIG. 4, the preferred embodiment of the present invention has a tubular structure 40 which has an interior wall structure 50 and an exterior wall structure 60 connected by a plurality of radially oriented wall structures 70 located between interior wall structure 50 and exterior wall structure 60. Interior wall structure 50, exterior wall structure 60, and radial wall structures 70 are all hollow and in fluid communication with one another. Longitudinally oriented isolation chambers 42 are formed between interior wall structure 50, exterior wall structure 60 and radial wall structures 70. Interior wall structure 50 has an inside wall 51, an outside wall 52, and a plurality of generally oval shaped interior portal walls 53 between and transverse to inside wall 51 and outside wall 52. Interior portal walls 53 form interior portals 54 in interior wall structure 50 which align with isolation chambers 42. Exterior wall structure 60 has an inside wall 61, an outside wall 62, and a plurality of generally oval shaped exterior portal walls 63 between and transverse to inside wall 61 and outside wall 62. Exterior portal walls 63 form exterior portals 64 in exterior wall structure 60 which align with isolation chambers 42. Interior portals 54 and exterior portals 64 allow isolation chambers 42 to be in fluid communication with the space inside of inside wall 51 and outside of outside wall 62. Radial wall structures 70 each have a first wall 71 and a second wall 72 with the space between them, the space between walls 51 and 52, and the space between walls 61 and 62 all being in fluid communication. Top wall 55 and lower wall 56 connect and seal walls 51, 52, 61, 62, 71, and 72 to form a closed space into which cryogenic material such as liquid nitrogen is placed to cool tubular structure 40. An upper portion of interior wall structure 50 has a greatly enlarged hollow portion 57 formed by a reduced diameter section 58 of inside wall 51 and an annular wall portion 59 below wall portion 58. Hollow portion 57 is connected to an external source (not shown) of cryogenic material, and hollow portion 57 provides a sizable reservoir of cryogenic material for feeding the space in wall structures 70, 50, and 60. The large volume of cryogenic material in portion 57 also creates a thermal mass to cool tubular structure 40 and interior space 24 of chamber 14 shown in FIG. 3.

Referring to FIGS. 3 and 4, a plurality of effusion cells 10 are positioned such that end 11 of each cell 10 extends through an exterior portal 64 in exterior wall structure 60 and will effuse material 17 into an isolation chamber 42 and through an interior portal 54 in interior wall structure 50 in a beam 16 directed toward substrate 18. The size of exterior portal 64 is sufficient to accommodate effusion cell 10 mounted at an angle which directs beam 16 directly at substrate 18. Interior portal 54 is sized and located higher with respect to exterior portal 64 to optimize the direction and spread of beam 16 to cover substrate 18 with minimum overspray.

Effusion material 17 from a cell 10 fills the isolation chamber 42 in which that cell is mounted, but there is no leakage of effusion material from one isolation chamber 42 to another. Each isolation chamber 42 has an orifice 44 through which a stream 46 of effused material 17 passes. A sensor 48, such as an ion gauge, monitors stream 46 and regulates the intensity of the effused material 17 emitted from a cell. Shutter 22 operates to open and close interior portal 54 to start and stop beam 16. Since effused material 17 from a cell 10 is continuously effused into isolation chamber 42, a steady state condition can be achieved and controlled using a closed loop feedback control system between sensor 48 and a heat source for cell 10A or a valve 11 for cell 10B. The proper intensity of effused material 17 can be achieved in isolation chamber 42 before shutter 22 is opened to expose substrate 18 to beam 16.

Prior art systems use a shutter near the end 11 of cell 10 to curtail and redirect the effusion material 17 emitted from a cell. Such a use of a shutter significantly affects the temperature of the cell and, therefore the effusion rate. A significant transient effect on the output of cell occurs with each opening and closing of the shutter. With the shutter 22 position in tubular structure 40 of the present invention, the transient effect of opening and closing shutter 22 on the intensity of effused material emitted from cell 10 is greatly diminished since such shutter operation does not curtail the emission of effused material from cell 10, and therefore, has less effect on the temperature of cell 10.

Also with the shutter 22 position in tubular structure 40, effused material 17 is contained inside isolation chamber 42 when shutter 22 is closed so as to minimize material deposited on vertical wall 30 of cryopanels 28.

Figure 5:
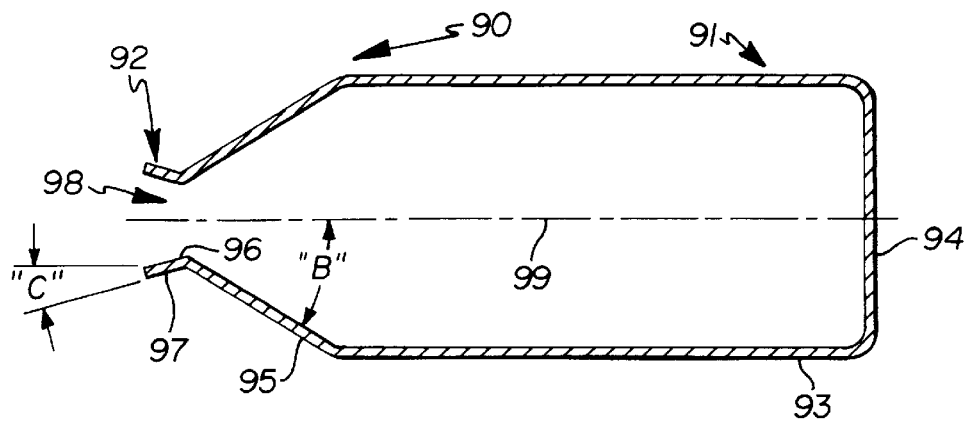
FIG. 5 is a front view of a unibody crucible which can be used with the present invention.

With the chamber 14 having tubular structure 40 of the present invention, effusion cells 10 do not extend inside interior portals 54. Therefore, cells 10 are not exposed to effusion debris which may fall from wall portions 58 or 59 during operation. While the chamber 14 having tubular structure 40 of the present invention may be used with many effusion cell designs, it is most effective when used with an effusion cell containing a unibody crucible 90 as disclosed in U.S. patent application Ser. No. 08/433,033 entitled UNIBODY CRUCIBLE AND METHOD OF MANUFACTURE THEREFOR. Such a crucible 90 is characterized by the features illustrated in FIG. 5. The one piece design crucible 90 is cylindrical and generally comprises a cylindrical base section 91 and a conical section 92, with a first or outer orifice 98 disposed at one end of the conical section 92. The cylindrical base section 91 has straight side walls 93 and a bottom wall 94 closing one end. Tapered wall 95 is disposed at the opposite end of the wall 93 and has a negative draft angle "B". Conical section 92 has a tapered wall 97 with a positive draft angle "C". Inner orifice 96 is at the juncture of tapered wall 95 and tapered wall 97.

The unibody crucible 90 virtually eliminates depletion effect by providing a melt surface which is consistent in size (area) and shape. The portion of the melt surface "seen" by the substrate is equivalent to the size of the inner orifice 96. In contrast, in crucibles which are conic throughout, the melt surface area decreases as the melt charge depletes in volume, thus causing them to exhibit depletion effects. Another advantage of the unibody crucible 90 is the large crucible volume provided by the straight wall, cylindrical base section 91, which increases useful capacity in comparison to conical crucibles. A further advantage is that the inner orifice 96 forms a thermal baffle between the melt and the shutter, thereby improving hydrodynamic stability and reducing shutter-related transients.

Figure 6:
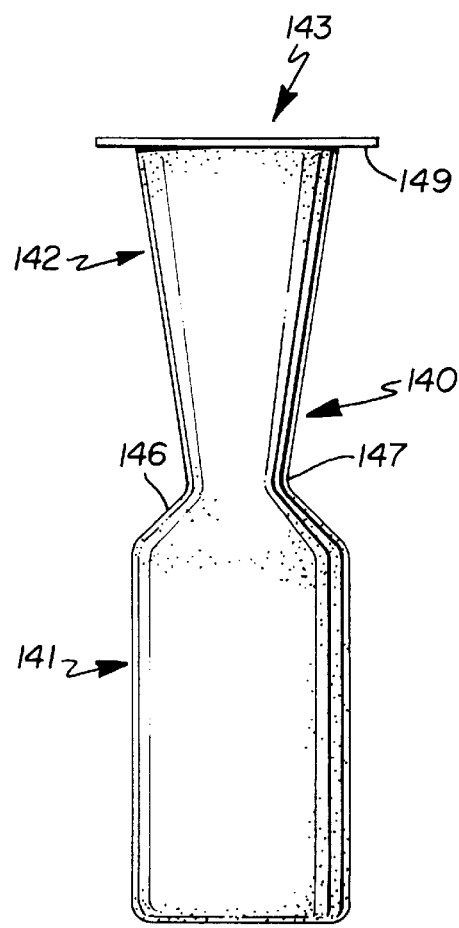
FIG. 6 is a crossectional view, taken along the center axis, of another embodiment of a unibody crucible which can be used with the present invention.

Another embodiment of a unibody crucible 140 is shown in FIG. 6. As in crucible 90, crucible 140 has a cylindrical section 141, negative draft wall 146, and inner orifice 147 of similar proportion to their corresponding parts in crucible 90. But integral conical section 142 is much longer and outer orifice 143 much larger than their corresponding parts 92 and 98 respectively of crucible 90, and has a sizable lip 149. The integrally formed conical section 142 enables optimal positioning of a tip filament of a dual filament heating system to minimize oval defect production.

The crucibles 90 and 140 are preferably constructed of pyrolytic boron nitride (PBN) via a vapor deposition process.

Figure 7:
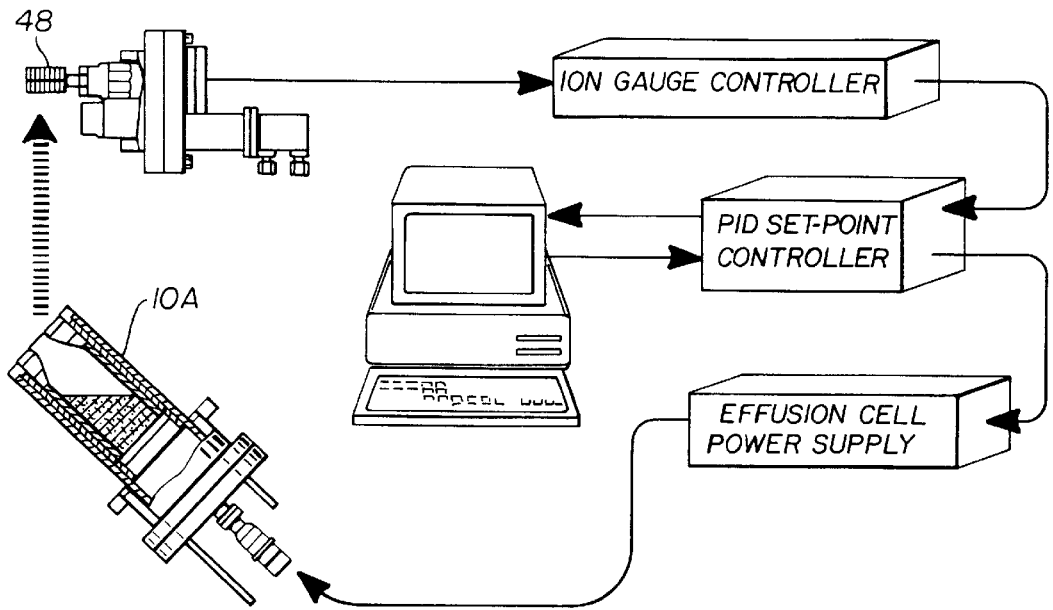
FIG. 7 is a schematic diagram of a closed loop control system used as part of the present invention to control a heat element in an effusion cell.
Figure 8:
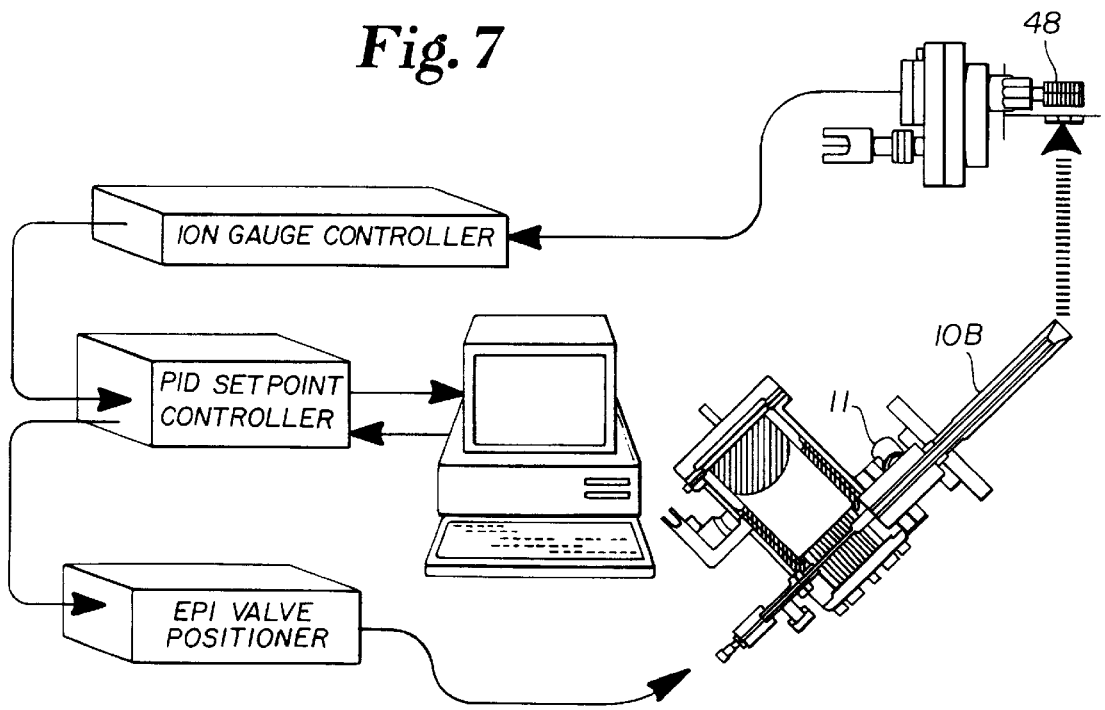
FIG. 8 is a schematic diagram of a closed loop control system used as part of the present invention to control a valve in an effusion cell.

The isolation chambers of the present invention facilitate measurement and control if individual materials effused from separate cells even when those cells are operated simultaneously. A closed loop control system can control individual cells, and a cooperating computer program can control the sequencing of cells. Referring to FIGS. 7 and 8, a typical closed loop control system operating between sensor 48 and effusion cells 10a or 10B is schematically illustrated. Sensor 48 is preferably an ion gauge which provides a signal processed by an ion gauge controller. The output of the ion gauge controller is an input for a PID set point controller, the output of which controls either a power supply for a heat source in an effusion cell of configuration 10A or a valve positioner for a control valve 13 on an effusion cell of configuration 10B. Computer software such as "Molly 5.0" by EPI MBE Equipment Group, 1290 Hammond Road, St. Paul, Minn. 55110 can interface with the PID set point controller and shutter controllers (not shown) to automate the growth process in any solid-source MBE system.

The descriptions above and the accompanying drawings should be interpreted in the illustrative and not the limited sense. While the invention has been disclosed in connection with the preferred embodiment or embodiments thereof, it should be understood that there may be other embodiments which fall within the scope of the invention as defined by the following claims. Where a claim is expressed as a means or step for performing a specified function it is intended that such claim be construed to cover the corresponding structure, material, or acts described in the specification and equivalents thereof, including both structural equivalents and equivalent structures.

What is claimed is:

1. An isolation assembly for use in a molecular beam epitaxy (MBE) growth chamber including at least one effusion cell, comprising:
   (a) a body structure with an interior and having an open end oriented with an effusion cell and directing a portion of material discharged from the effusion cell along said interior, and
   (b) a sensor communicatively connected to said body structure to receive said portion of material discharged from the effusion cell and directed along said body structure interior.

2. The isolation assembly of claim 1, further comprising a closed loop feedback system communicatively connecting said sensor and at least one effusion cell to control output of material from said effusion cell.

3. The isolation assembly of claim 2 wherein said closed loop feedback system controls a heat source in an effusion cell.

4. The isolation assembly of claim 2 wherein said closed loop feedback system controls a valve positioner for an effusion cell.

5. The isolation assembly of claim 1 wherein said isolation assembly has means for cooling to cryogenic temperatures.

* * * * *